(12) United States Patent
Li et al.

(10) Patent No.: US 9,922,719 B2
(45) Date of Patent: Mar. 20, 2018

(54) MULTI-VT SENSING METHOD BY VARYING BIT LINE VOLTAGE

(71) Applicant: SANDISK TECHNOLOGIES INC., Plano, TX (US)

(72) Inventors: Yen-Lung Li, San Jose, CA (US); Deepanshu Dutta, Fremont, CA (US)

(73) Assignee: SANDISK TECHNOLOGIES LLC, Plano, TX (US)

(*) Notice: Subject to any disclaimer, the term of this patent is extended or adjusted under 35 U.S.C. 154(b) by 0 days.

(21) Appl. No.: 14/924,129

(22) Filed: Oct. 27, 2015

(65) Prior Publication Data

US 2016/0358664 A1 Dec. 8, 2016

Related U.S. Application Data

(60) Provisional application No. 62/172,182, filed on Jun. 7, 2015.

(51) Int. Cl.
| | |
|---|---|
| *G11C 16/34* | (2006.01) |
| *G11C 16/12* | (2006.01) |
| *G11C 16/28* | (2006.01) |
| *G11C 11/56* | (2006.01) |
| *G11C 16/10* | (2006.01) |
| *G11C 16/24* | (2006.01) |
| *G11C 16/32* | (2006.01) |
| *G11C 16/04* | (2006.01) |

(52) U.S. Cl.
CPC ...... *G11C 16/3459* (2013.01); *G11C 11/5642* (2013.01); *G11C 16/10* (2013.01); *G11C 16/12* (2013.01); *G11C 16/24* (2013.01); *G11C 16/28* (2013.01); *G11C 16/32* (2013.01); *G11C 16/0483* (2013.01); *G11C 2211/5621* (2013.01)

(58) Field of Classification Search
CPC ..... G11C 16/3459; G11C 16/12; G11C 16/28; G11C 16/10; G11C 16/24; G11C 16/32; G11C 16/0483; G11C 11/5642; G11C 11/5621
USPC ..... 365/185.22, 185.21, 185.24, 185.26, 148
See application file for complete search history.

(56) References Cited

U.S. PATENT DOCUMENTS

| | | | | |
|---|---|---|---|---|
| 5,969,985 | A * | 10/1999 | Tanaka | G11C 7/1006 365/185.03 |
| 6,222,762 | B1 * | 4/2001 | Guterman | G11C 11/5621 257/E27.103 |

(Continued)

*Primary Examiner* — Vu Le
*Assistant Examiner* — Sung Cho
(74) *Attorney, Agent, or Firm* — Vierra Magen Marcus LLP

(57) ABSTRACT

Methods and systems for verifying two or more programming states at the same time are described. During a program verify operation, two or more memory cell threshold voltage levels may be concurrently verified by applying a word line voltage to a plurality of memory cells, applying two or more different bit line voltages to the plurality of memory cells, and sensing the plurality of memory cells while the two or more different bit line voltages are applied to the plurality of memory cells. The bit line voltages applied during the program verify operation may allow a first set of the plurality of memory cells to be sensed at a first voltage level while a second set of the plurality of memory cells are sensed at a second voltage level different from the first voltage level.

18 Claims, 9 Drawing Sheets

(56) References Cited

U.S. PATENT DOCUMENTS

| | | | |
|---|---|---|---|
| 6,370,056 B1* | 4/2002 | Chen | G11C 11/22 365/145 |
| 6,587,367 B1* | 7/2003 | Nishimura | G11C 7/14 365/145 |
| 7,002,843 B2* | 2/2006 | Guterman | G11C 11/5628 365/185.03 |
| 7,020,026 B2 | 3/2006 | Guterman | |
| 7,023,733 B2* | 4/2006 | Guterman | G11C 16/0483 365/185.17 |
| 7,068,539 B2 | 6/2006 | Guterman | |
| 7,088,621 B2 | 8/2006 | Guterman | |
| 7,139,198 B2* | 11/2006 | Guterman | G11C 11/5628 365/185.22 |
| 7,280,408 B2 | 10/2007 | Guterman | |
| 7,301,812 B2 | 11/2007 | Guterman | |
| 7,317,638 B2 | 1/2008 | Guterman | |
| 7,349,264 B2* | 3/2008 | Mokhlesi | G11C 16/28 365/185.21 |
| 7,411,827 B2 | 8/2008 | Guterman | |
| 7,414,887 B2 | 8/2008 | Guterman | |
| 7,447,075 B2 | 11/2008 | Guterman | |
| 7,453,730 B2 | 11/2008 | Guterman | |
| 7,460,406 B2 | 12/2008 | Mokhlesi | |
| 7,616,481 B2 | 11/2009 | Mokhlesi | |
| 8,111,548 B2 | 2/2012 | Mokhlesi | |
| 8,233,324 B2* | 7/2012 | Sharon | G11C 11/5642 365/185.03 |
| 8,248,851 B1* | 8/2012 | Pio | G11C 11/5642 365/185.11 |
| 8,321,727 B2 | 11/2012 | D'Abreu | |
| 8,498,152 B2 | 7/2013 | Alrod | |
| 8,509,000 B2 | 8/2013 | Sharon | |
| 8,619,459 B1* | 12/2013 | Nguyen | G11C 13/004 365/148 |
| 8,773,887 B1* | 7/2014 | Naji | G11C 11/165 365/148 |
| 8,873,285 B2 | 10/2014 | Sharon | |
| 9,443,576 B1* | 9/2016 | Miller | G11C 11/44 |
| 2006/0291285 A1* | 12/2006 | Mokhlesi | G11C 11/5628 365/185.18 |
| 2009/0003033 A1* | 1/2009 | Nirschl | G11C 13/00 365/148 |
| 2009/0067229 A1* | 3/2009 | Kang | G11C 8/06 365/163 |
| 2010/0074015 A1* | 3/2010 | Chandrasekhar | G11C 11/5642 365/185.17 |
| 2010/0085797 A1* | 4/2010 | Li | G11C 7/02 365/148 |
| 2011/0032757 A1* | 2/2011 | Dutta | G11C 11/5628 365/185.02 |
| 2011/0051520 A1* | 3/2011 | Kim | G11C 11/5628 365/185.19 |
| 2011/0170332 A1* | 7/2011 | Oh | G11C 5/145 365/148 |
| 2012/0218807 A1* | 8/2012 | Johnson | G11C 11/56 365/148 |
| 2013/0064000 A1* | 3/2013 | Hamada | G11C 7/02 365/148 |
| 2013/0083607 A1* | 4/2013 | Joo | G11C 16/26 365/185.21 |
| 2014/0003147 A1* | 1/2014 | Dutta | G11C 11/5635 365/185.11 |
| 2014/0169069 A1* | 6/2014 | Oh | G11C 11/1673 365/148 |
| 2015/0009756 A1* | 1/2015 | D'Alessandro | G11C 16/26 365/185.17 |
| 2015/0070972 A1* | 3/2015 | Kitagawa | G11C 13/004 365/148 |
| 2015/0348624 A1* | 12/2015 | Jang | G11C 13/004 365/148 |
| 2016/0035415 A1* | 2/2016 | Pelley | G11C 13/004 365/72 |
| 2016/0111153 A1* | 4/2016 | Tada | G11C 13/0011 365/148 |
| 2016/0172032 A1* | 6/2016 | Matsuoka | G11C 13/0069 365/148 |

* cited by examiner

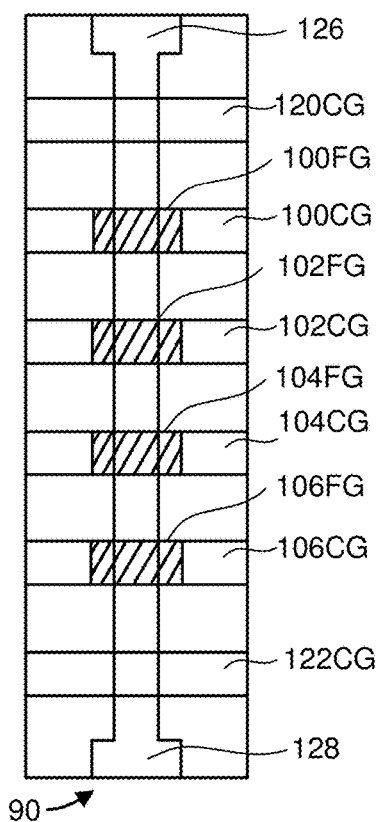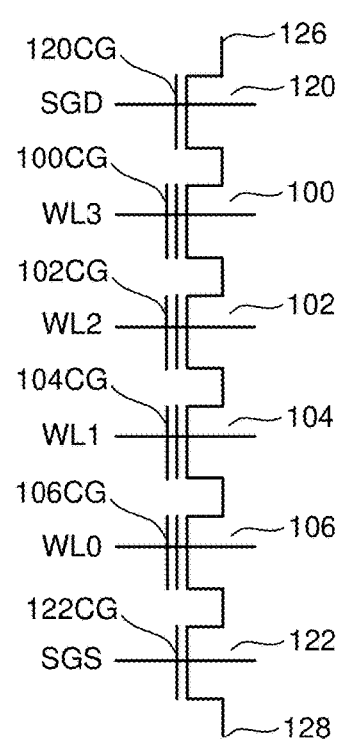
FIG. 1        FIG. 2

US 9,922,719 B2

1

MULTI-VT SENSING METHOD BY VARYING BIT LINE VOLTAGE

CLAIM OF PRIORITY

The present application claims priority to U.S. Provisional Application No. 62/172,182, entitled "Multi-VT Sensing Method," filed Jun. 7, 2015, which is herein incorporated by reference in its entirety.

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Both flash memory and EEPROM utilize floating-gate transistors. For each floating-gate transistor, a floating gate is positioned above and insulated from a channel region of the floating-gate transistor. The channel region is positioned between source and drain regions of the floating-gate transistor. A control gate is positioned above and insulated from the floating gate. The threshold voltage of the floating-gate transistor may be controlled by setting the amount of charge stored on the floating gate. The amount of charge on the floating gate is typically controlled using Fowler-Nordheim (F-N) tunneling or hot-electron injection. The ability to adjust the threshold voltage allows a floating-gate transistor to act as a non-volatile storage element or memory cell. In some cases, more than one data bit per memory cell (i.e., a multi-level or multi-state memory cell) may be provided by programming and reading multiple threshold voltages or threshold voltage ranges.

NAND flash memory structures typically arrange multiple floating-gate transistors in series with and between two select gates. The floating-gate transistors in series and the select gates may be referred to as a NAND string. In recent years, NAND flash memory has been scaled in order to reduce cost per bit. However, as process geometries shrink, many design and process challenges are presented. These challenges include increased variability in transistor characteristics over process, voltage, and temperature variations.

BRIEF DESCRIPTION OF THE DRAWINGS

FIG. 1 depicts one embodiment of a NAND string.

FIG. 2 depicts one embodiment of the NAND string of FIG. 1 using a corresponding circuit diagram.

2

Figures 6A, 6B:
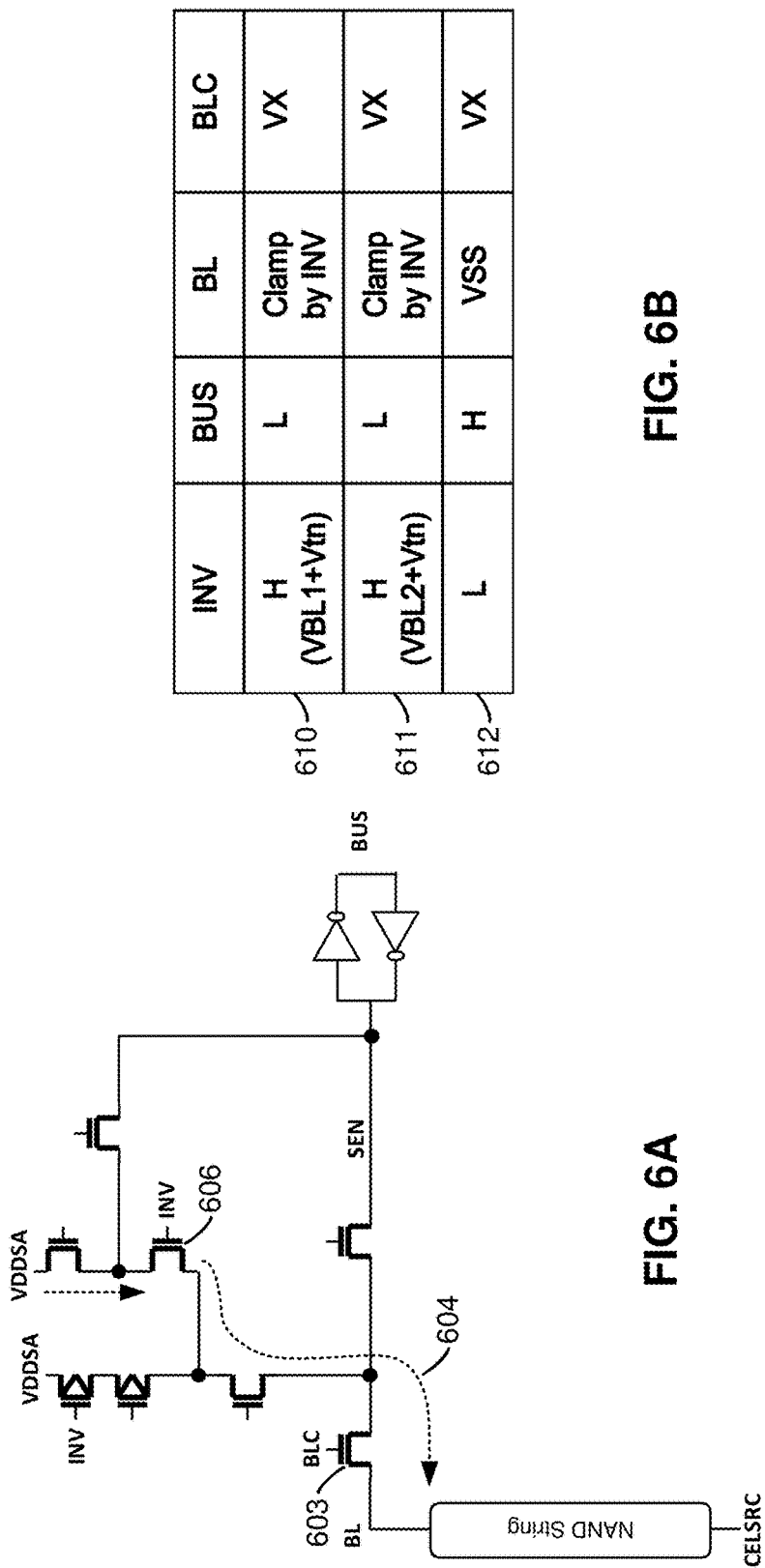

FIG. 6A depicts one embodiment of a portion of a sense amplifier for biasing a bit line to a particular bit line voltage.

FIG. 6B depicts one embodiment of a table showing various settings for a gate of an NMOS transistor in a source follower configuration.

Figure 6C:
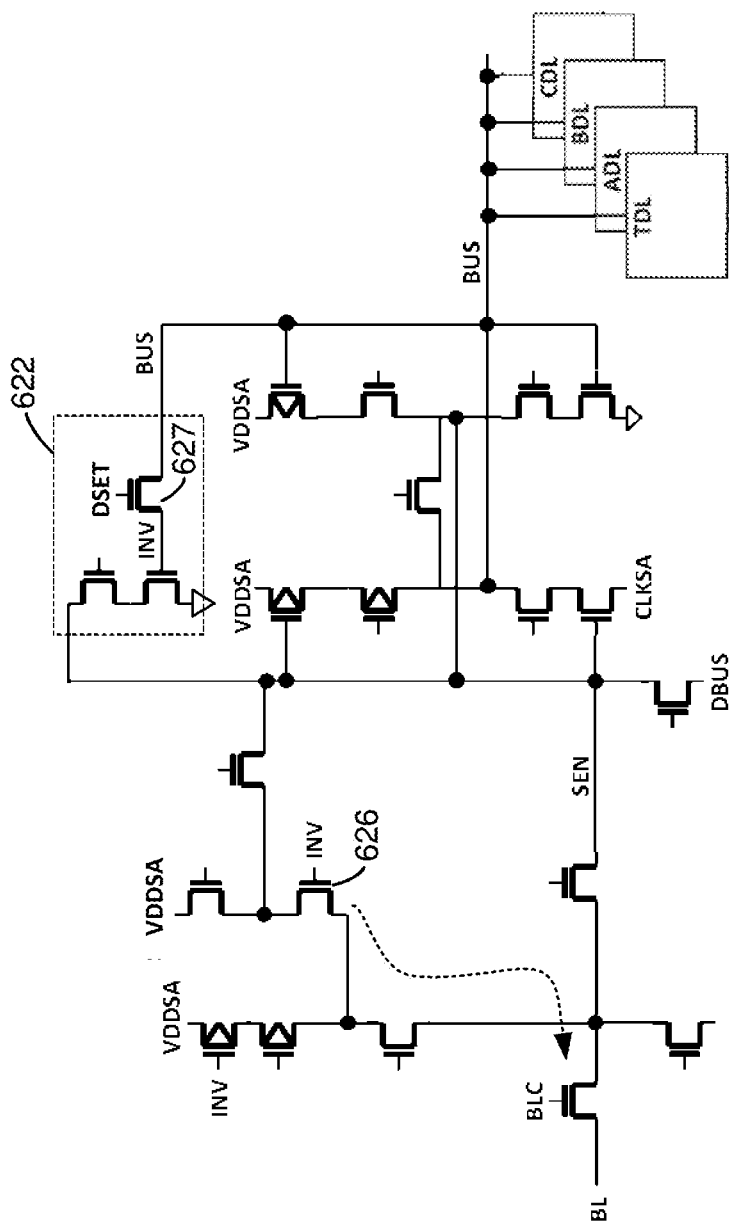

FIG. 6C depicts one embodiment of a portion of a sense amplifier that may be used for biasing a bit line to a particular bit line voltage during a program verify operation.

Figure 7A:
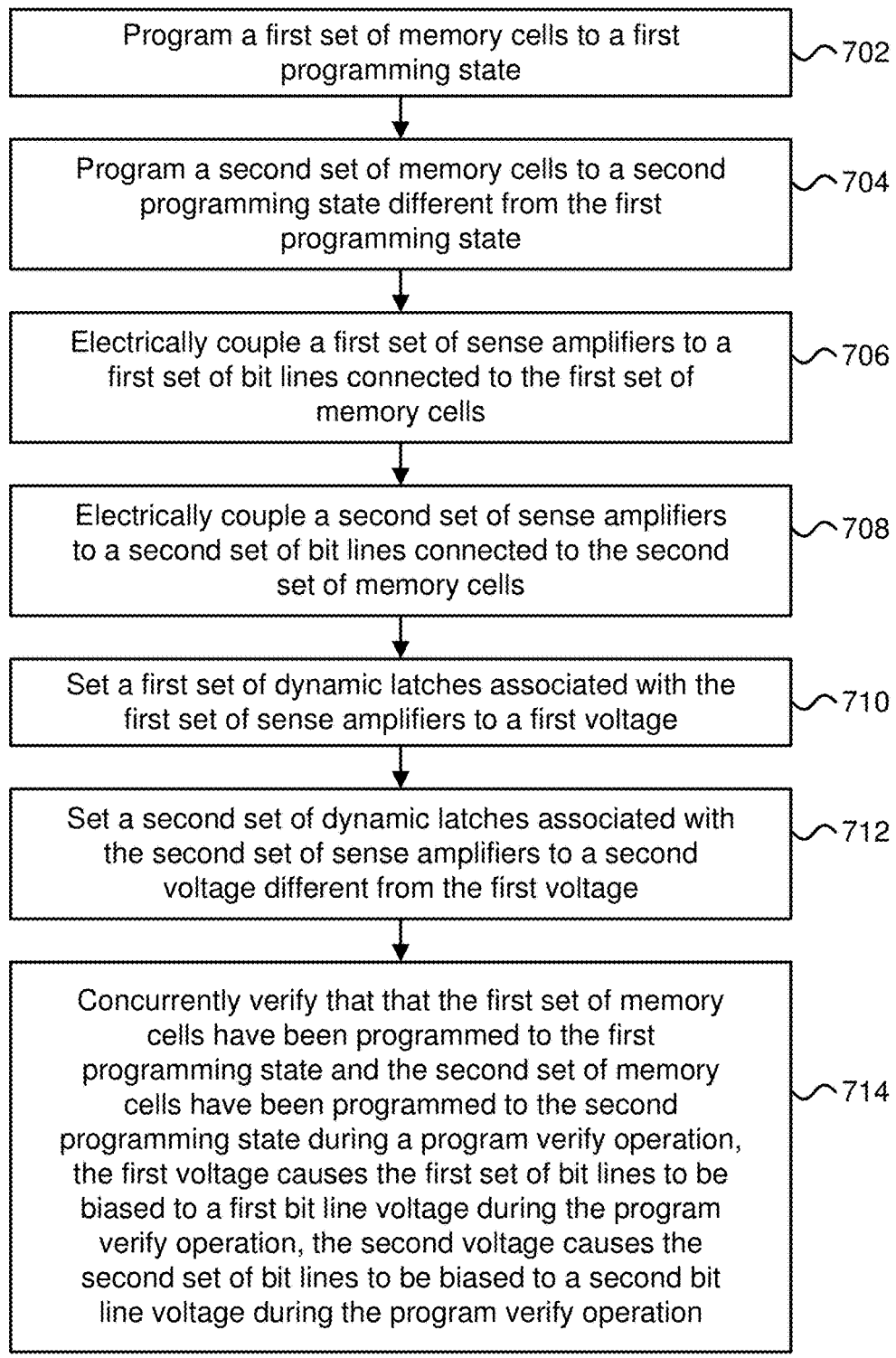

FIG. 7A is a flowchart describing one embodiment of a process for performing a program verify operation.

Figure 7B:
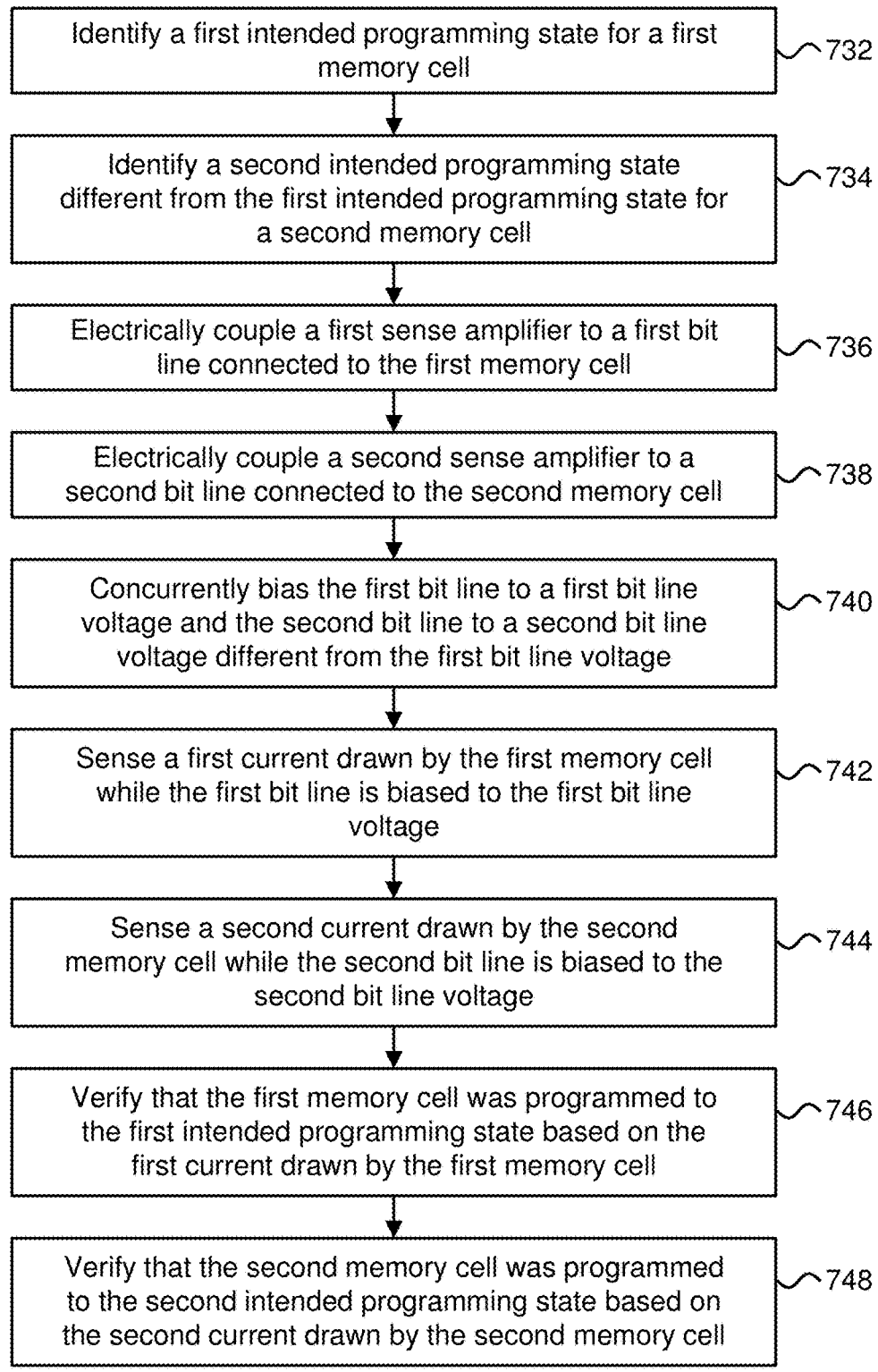

FIG. 7B is a flowchart describing another embodiment of a process for performing a program verify operation.

DETAILED DESCRIPTION

Technology is described for verifying two or more programming states at the same time. In some cases, during a program verify operation, two or more memory cell programming states or memory cell threshold voltage levels may be concurrently verified by applying a word line voltage to a plurality of memory cells, applying two or more different bit line voltages to the plurality of memory cells, and sensing the plurality of memory cells while the two or more different bit line voltages are applied to the plurality of memory cells. The bit line voltages applied during the program verify operation may allow a first set of the plurality of memory cells to be sensed at a first verify voltage level and a second set of the plurality of memory cells to be sensed at a second verify voltage level different from the first verify voltage level while biasing the plurality of memory cells to the same word line voltage or control gate (CG) voltage. In one example, during the program verify operation, a first memory cell of the plurality of memory cells may be sensed to verify that the first memory cell has reached a first programming state (e.g., the B state) while a second memory cell of the plurality of memory cells is sensed to verify that the second memory cell has reached a second programming state different from the first programming state (e.g., the D state). Verifying two or more memory cell threshold voltage levels at the same time may reduce the number of program verify cycles required for verifying the programming states of the plurality of memory cells.

In one embodiment, each memory cell of a plurality of memory cells connected to a word line may be programmed to one of eight different programming states during one or more programming operations. Between programming operations or subsequent to the one or more programming operations, one or more program verify operations may be performed to verify the intermediary or final programming states for the plurality of memory cells. During a program verify operation of the one or more program verify operations, two or more memory cell threshold voltage levels may be concurrently verified. In one embodiment, a first verify level (e.g., 1V) may be applied to a first set of the plurality of memory cells while a second verify level greater than the first verify level (e.g., 2V) is applied to a second set of the plurality of memory cells. Verifying two different verify levels at the same time may allow the time required to verify programming states to be cut in half. In another embodiment, each memory cell of the plurality of memory cells may have one of eight different verify levels applied to the memory cell during the program verify operation. The verify level applied to each memory cell during the program verify operation may depend on the intended programming state for the memory cell. In some cases, each memory cell of the plurality of memory cells may correspond with a floating-gate transistor or a NAND-type flash memory cell.

In some embodiments, a dynamic node within a sense amplifier that is electrically coupled to a bit line during a program verify operation may be set based on an intended programming state for a memory cell connected to the bit line. The dynamic node may be left floating during the program verify operation or during a portion of the program verify operation. The dynamic node may correspond with a dynamic latch node of a dynamic latch. The dynamic latch may latch an analog voltage on the dynamic latch node. The dynamic latch may be set to one of a plurality of different voltage levels based on the verify level to be applied to the bit line during the program verify operation. In one example, the dynamic latch may hold or store a voltage that is one transistor threshold voltage (e.g., an NMOS transistor threshold voltage) above the verify level to be applied to the bit line. The dynamic latch may be loaded using an NMOS transistor in a source follower configuration with its gate (e.g., DSET) set to two transistor threshold voltages above the verify level to be applied to the bit line. In some cases, a plurality of dynamic latches associated with a plurality of sense amplifiers connected to a plurality of bit lines during a program verify operation may be set during an initialization phase in which dynamic latches corresponding with higher verify levels are set prior to dynamic latches corresponding with lower verify levels.

In other embodiments, an analog multiplexor within a sense amplifier may be used to select one of a plurality of different voltage levels based on the verify level to be applied to a bit line. The verify level to be applied may depend on the intended programming state for a memory cell connected to the bit line. In one example, an eight input analog multiplexor may be used to select one of eight different voltage levels corresponding with eight different verify levels to be applied to the bit line during a program verify operation. In one example, the analog multiplexor may select a voltage that is roughly one transistor threshold voltage above the verify level to be applied to the bit line. Thus, each bit line may be set to the appropriate verify level on a per bit basis based on an intended programming state for a memory cell connected to the bit line.

In one embodiment, two or more memory cell threshold voltage levels may be concurrently verified during an even/odd verification operation (e.g., only even bit lines or only odd bit lines are verified during the verification operation) or during an all-bit-line (ABL) verification operation (e.g., both even bit lines and odd bit lines are verified during the verification operation).

The methods and systems described herein may be used for verifying programming states of memory cells within a non-volatile storage system. In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate or substantially orthogonal to the substrate (e.g., within 2-5 degrees of a normal vector that is orthogonal to the substrate). In one example, a non-volatile storage system may include a memory array with vertical bit lines or bit lines that are arranged orthogonal to a semiconductor substrate. The substrate may comprise a silicon substrate. The memory array may comprise various memory structures including planar NAND structures, vertical NAND structures, Bit Cost Scalable (BiCS) NAND structures, 3D NAND structures, or 3D ReRAM structures.

In one embodiment, the memory cells within a memory array may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) memory cells. In other cases, the re-writeable non-volatile memory cells may comprise conductive bridge memory cells or programmable metallization memory cells.

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

FIG. 1 depicts one embodiment of a NAND string 90. FIG. 2 depicts one embodiment of the NAND string of FIG. 1 using a corresponding circuit diagram. As depicted, NAND string 90 includes four transistors, 100, 102, 104, and 106, in series between a first select gate 120 (i.e., a drain-side select gate) and a second select gate 122 (i.e., a source-side select gate). Select gate 120 connects the NAND string 90 to a bit line 126. Select gate 122 connects the NAND string 90 to a source line 128. Select gate 120 is controlled by applying the appropriate voltage to control gate 120CG (i.e., via select line SGD of FIG. 2). Select gate 122 is controlled by applying the appropriate voltage to control gate 122CG (i.e., via select line SGS of FIG. 2). Each of the transistors 100, 102, 104, and 106 includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gates 100CG, 102CG, 104CG, and 106CG are connected to word lines WL3, WL2, WL1, and WL0, respectively.

Note that although FIGS. 1 and 2 show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND flash memory structure includes a plurality of NAND strings within a memory block. A memory block may comprise a unit of erase. In some cases, the NAND strings within a memory block may share a common well (e.g., a P-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

In some embodiments, during a programming operation, storage elements that are not to be programmed (e.g., storage elements that have previously completed programming to a target data state) may be inhibited or locked out from programming by boosting associated channel regions (e.g., self-boosting the channel regions via word line coupling). An unselected storage element (or unselected NAND string) may be referred to as an inhibited or locked out storage element (or inhibited NAND string) as it is inhibited or locked out from programming during a given programming iteration of a programming operation.

Although technology using NAND-type flash memory may be described herein, the technology disclosed herein may also be applied to other types of non-volatile storage devices and architectures (e.g., NOR-type flash memory). Moreover, although technology using floating-gate transistors is described herein, the technology described herein may also be applied to or used with other memory technologies including those that employ charge trapping, phase-change (e.g., chalcogenide materials), or state-change materials.

Figure 3A:
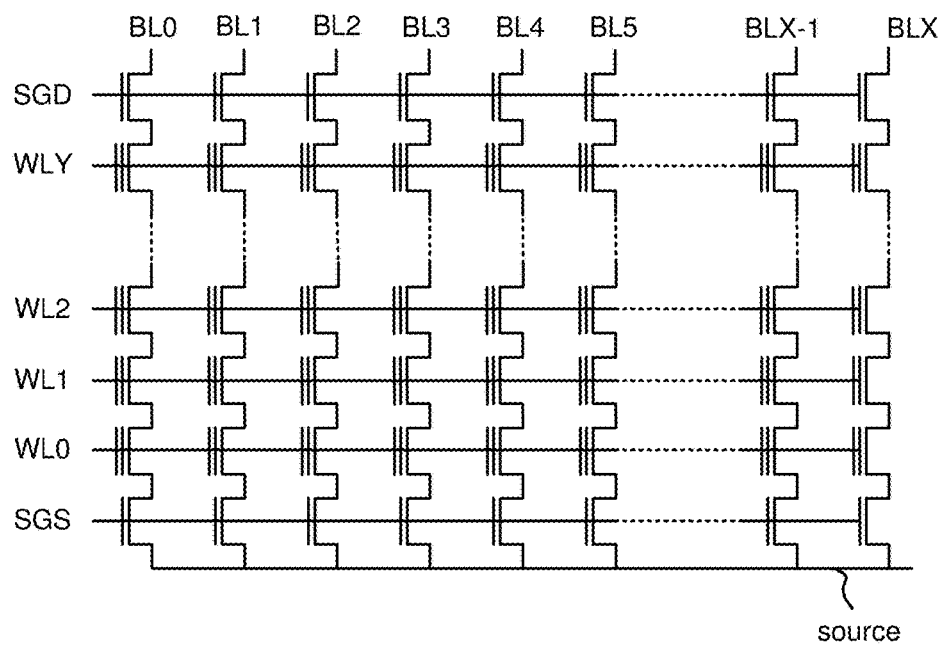
FIG. 3A depicts one embodiment of a memory block including a plurality of NAND strings.

FIG. 3A depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS. In one embodiment, the source-side select gate controlled by source-side selection signal SGS and the drain-side select gate controlled by the drain-side selection signal SGD may comprise transistors without floating gates or transistors that include a floating gate structure.

In one embodiment, during a programming operation, when programming a memory cell, such as a NAND flash memory cell, a program voltage may be applied to the control gate of the memory cell and the corresponding bit line may be grounded. These programming bias conditions may cause electrons to be injected into the floating gate via field-assisted electron tunneling, thereby raising the threshold voltage of the memory cell. The program voltage applied to the control gate during a program operation may be applied as a series of pulses. In some cases, the magnitude of the programming pulses may be increased with each successive pulse by a predetermined step size. Between programming pulses, one or more verify operations may be performed. During the programming operation, memory cells that have reached their intended programming states may be locked out and inhibited from programming by boosting the channel regions of the program inhibited memory cells.

In one embodiment, memory cells may be erased by raising the p-well to an erase voltage (e.g., 20 volts) for a sufficient period of time and grounding the word lines of a selected block of memory cells while the source and bit lines are floating. These erase bias conditions may cause electrons to be transferred from the floating gate through the tunneling oxide, thereby lowering the threshold voltage of the memory cells within the selected block. In some cases, an erase operation may be performed on an entire memory plane, on individual blocks within a memory plane, or another unit of memory cells.

In some embodiments, during verify operations and/or read operations, a selected word line may be connected (or biased) to a voltage, a level of which is specified for each read and verify operation in order to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell may be measured by the rate it discharges or charges a dedicated capacitor in a sense amplifier. In another example, the conduction current of the selected memory cell allows (or fails to allow) the NAND string that included the memory cell to discharge a voltage on the corresponding bit line. The voltage of the bit line (or the voltage across a dedicated capacitor in a sense amplifier) may be measured after a period of time to determine whether the bit line has been discharged by a particular amount or not.

Figure 3B:
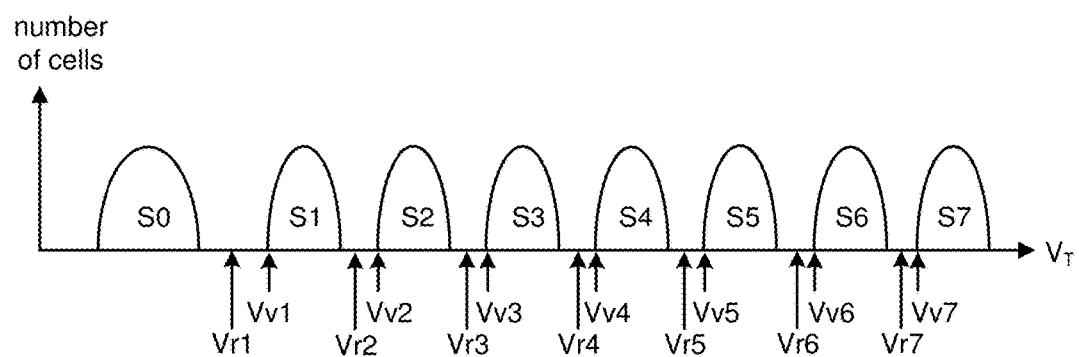
FIG. 3B depicts one embodiment of possible threshold voltage distributions for a three-bit-per-cell memory cell.

FIG. 3B depicts one embodiment of possible threshold voltage distributions (or data states) for a three-bit-per-cell memory cell (i.e., the memory cell may store three bits of data). Other embodiments, however, may use more than or less than three bits of data per memory cell (e.g., such as four or more bits of data per memory cell). At the end of a successful programming process (with verification), the threshold voltages of memory cells within a memory page or memory block should be within one or more threshold voltage distributions for programmed memory cells or within a distribution of threshold voltages for erased memory cells, as appropriate.

As depicted, each memory cell may store three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7. In some cases, the data states S1-S7 may correspond with programming states. In one example, data state S2 may correspond with a B state and data state S3 may correspond with a C state.

Each data state S0-S7 corresponds to a unique value for the three bits stored in the memory cell. In one embodiment, S0=111, S1=110, S2=101, S3=100, S4=011, S5=010, S6=001 and S7=000. Other mappings of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page, and a third page. In some embodiments, all of the memory cells connected to the same word line would store data in the same three pages of data. In some embodiments, the memory cells connected to a word line can be grouped into different sets of pages (e.g., by odd and even bit lines).

In some example implementations, the memory cells will be erased to state S0. From state S0, the memory cells can be programmed to any of states S1-S7. Programming may be performed by applying a set of pulses with rising magnitudes to the control gates of the memory cells. Between pulses, a set of verify operations (or program verify operations) may be performed to determine whether the memory cells being programmed have reached their target threshold voltage (e.g., using verify levels Vv1, Vv2, Vv3, Vv4, Vv5, Vv6, and Vv7). Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7.

When reading memory cells that store three bits of data, multiple reads will be performed at read compare points Vr1, Vr2, Vr3, Vr4, Vr5, Vr6, and Vr7 to determine which state the memory cells are in. If a memory cell turns on in response to Vr1, then it is in state S0. If a memory cell turns on in response to Vr2 but does not turn on in response to Vr1, then it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7.

In some cases, a vertical NAND structure may comprise a vertical NAND string or a vertical inverted NAND string. A NAND string may comprise a string of floating gate transistors. An inverted NAND string may comprise a string of inverted floating gate transistors.

Figure 4A:
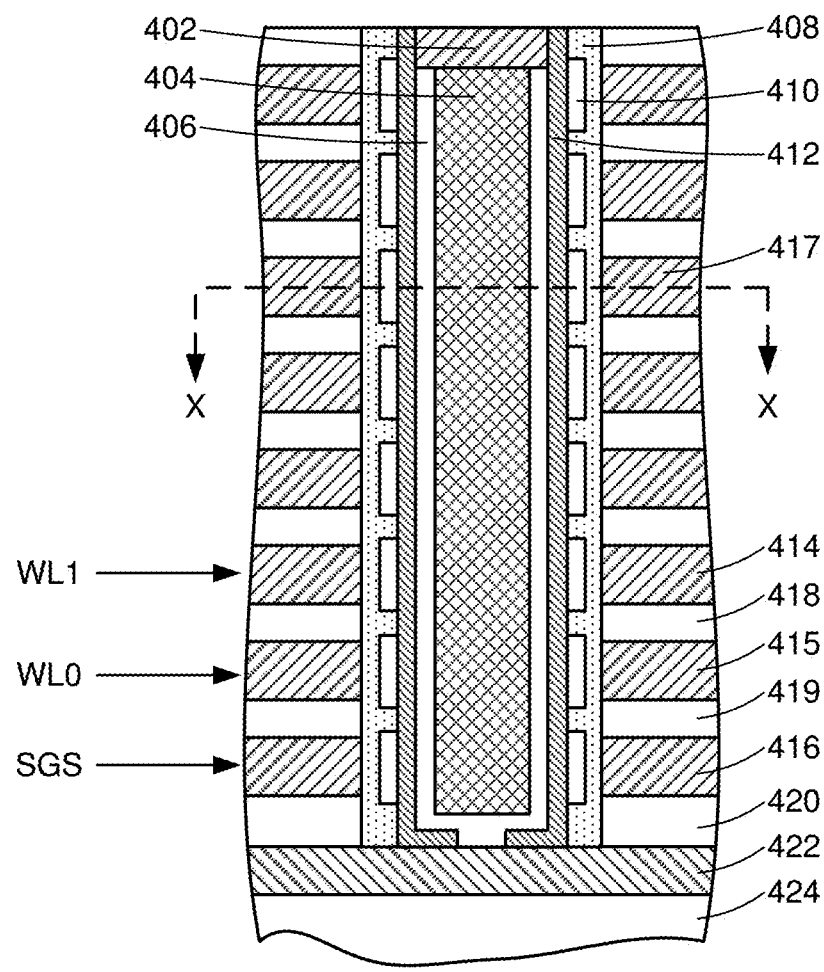
FIG. 4A depicts one embodiment of a vertical NAND structure.

FIG. 4A depicts one embodiment of a vertical NAND structure. The vertical NAND structure includes an inverted NAND string formed above the substrate 424 and oriented such that the inverted NAND string is orthogonal to the substrate 424. An inverted NAND string may comprise a NAND string that includes an inverted floating gate transistor with a tunneling oxide between a floating gate of the inverted floating gate transistor and a control gate of the inverted floating gate transistor. The arrangement of the tunneling oxide between the floating gate and the control gate allows the mechanism (e.g., F-N tunneling as the transport mechanism) for programming and/or erase of the inverted floating gate transistor to occur between the floating gate and the control gate rather than between the floating gate and the channel of the inverted floating gate transistor. The inverted NAND string may be arranged within a vertical memory hole that is etched through alternating layers of control gate material (e.g., tungsten, nitride, or polysilicon) and inter-gate insulator material (e.g., oxide or silicon dioxide). As depicted, the layers of control gate material include layer 417 and layers 414-416 and the layers of inter-gate insulator material include layers 418-420. The inter-gate insulator material layer 420 may be arranged above a source line layer 422 (e.g., doped polysilicon) that may be arranged above a substrate 424 (e.g., a silicon substrate). In some cases, a first word line (WL1) may correspond with control gate layer 414, a second word line (WL0) may correspond with control gate layer 415, and a source-side select gate line (SGS) may correspond with control gate layer 416.

In one embodiment, within the memory hole a tunneling layer material 408 (e.g., including a thin oxide), a floating gate material 410 (e.g., polysilicon), a dielectric layer 412 (e.g., oxide), and a channel layer material 406 (e.g., undoped polysilicon) may be deposited within the memory hole and arranged in order to form the inverted NAND string. As depicted in FIG. 4A, the tunneling layer material 408 is arranged within or inside of the memory hole. The tunneling layer material 408 may comprise a portion of a multi-layer dielectric stack such as an ONO dielectric stack, which includes alternating layers of silicon dioxide ("O") and silicon nitride ("N"). In some cases, the tunneling layer material 408 may comprise a high-K dielectric material (e.g., hafnium-based high-K dielectrics or hafnium oxide) that has a dielectric constant that is greater than that of silicon dioxide. In some cases, a core material layer 404 (e.g., oxide) may be formed within the memory hole. In other cases, the core material layer 404 may be omitted. A bit line contact layer 402 may be formed at the top of the memory hole and connect to or directly abut the channel layer material 406. The channel layer material 406 may connect to the source line layer 422 at the bottom of the memory hole. Thus, in this case, the bit line contact layer 402 connects to the inverted NAND string at the top of the memory hole and the source line contact layer 422 connects to the inverted NAND string at the bottom of the memory hole.

In one embodiment, the bit line contact layer 402 may comprise a material of a first conductivity type (e.g., n-type) and the source line contact layer 422 may comprise a material of a second conductivity type different from the first conductivity type (e.g., p-type). In one example, the bit line contact layer 402 may comprise an n-type material (e.g., n-type polysilicon) and the source line contact layer 422 may comprise a p-type material (e.g., p-type polysilicon). In another example, the bit line contact layer 402 may comprise a p-type material and the source line contact layer 422 may comprise an n-type material (e.g., n-type polysilicon). Thus, in some cases, the inverted NAND string may include an asymmetric source and drain that may be used to provide both an electron supply (via the n-type material) and a hole supply (via the p-type material) for memory operations (e.g., program, erase, and read operations) performed using the inverted NAND string. The memory operations may comprise n-channel operations and/or p-channel operations depending on the bias conditions applied to the inverted NAND string.

In one embodiment, an inverted NAND string may be formed using a core material layer (e.g., an oxide layer or other dielectric layer) that is arranged adjacent to a channel layer (e.g., an undoped polysilicon channel layer) that is arranged adjacent to a blocking layer (e.g., an oxide layer or other dielectric layer) that is arranged adjacent to a floating gate layer (or a charge trap layer) that is arranged adjacent to a tunneling layer (e.g., a thin oxide) that is arranged adjacent to a control gate layer (e.g., tungsten). The tunneling layer may have a thickness that is less than the thickness of the blocking layer.

Figure 4B:
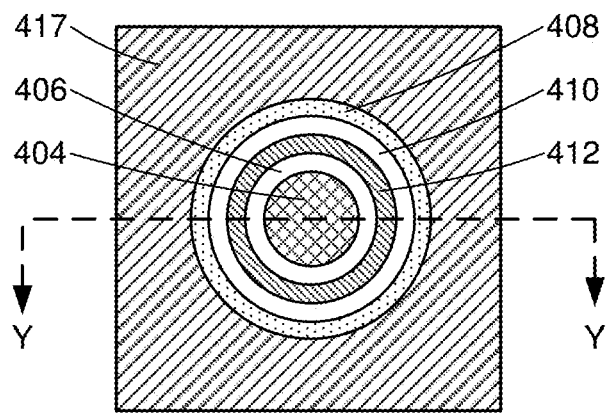
FIG. 4B depicts one embodiment of a cross-sectional view taken along line X-X of FIG. 4A.

FIG. 4B depicts one embodiment of a cross-sectional view taken along line X-X of FIG. 4A. As depicted, the inverted NAND string includes an inner core material layer 404 that is surrounded by the channel layer material 406 that is surrounded by the dielectric layer 412 that is surrounded by the floating gate material 410 that is surrounded by the tunneling layer material 408 that is surrounded by the control gate material layer 417. In one embodiment, FIG. 4A may depict a cross-sectional view taken along line Y-Y of FIG. 4B. In one embodiment, the inverted NAND string may be formed using a vertical cylindrical structure or a vertical tapered cylindrical structure. In this case, the dielectric material 412, floating gate material 410, tunneling layer material 408, and channel layer material 406 of the inverted NAND string may comprise vertical annular structures surrounding the core material layer 404. In another embodiment, the inverted NAND string may be formed using a vertical pillar structure or a vertical rectangular prism structure.

In some embodiments, a vertical NAND structure may include a vertical NAND string formed above a substrate and oriented such that the vertical NAND string is orthogonal to the substrate. The vertical NAND string may be arranged within a vertical memory hole that is etched through alternating layers of control gate material (e.g., tungsten or polysilicon) and inter-gate insulator material (e.g., oxide or silicon oxide).

Figure 5A:
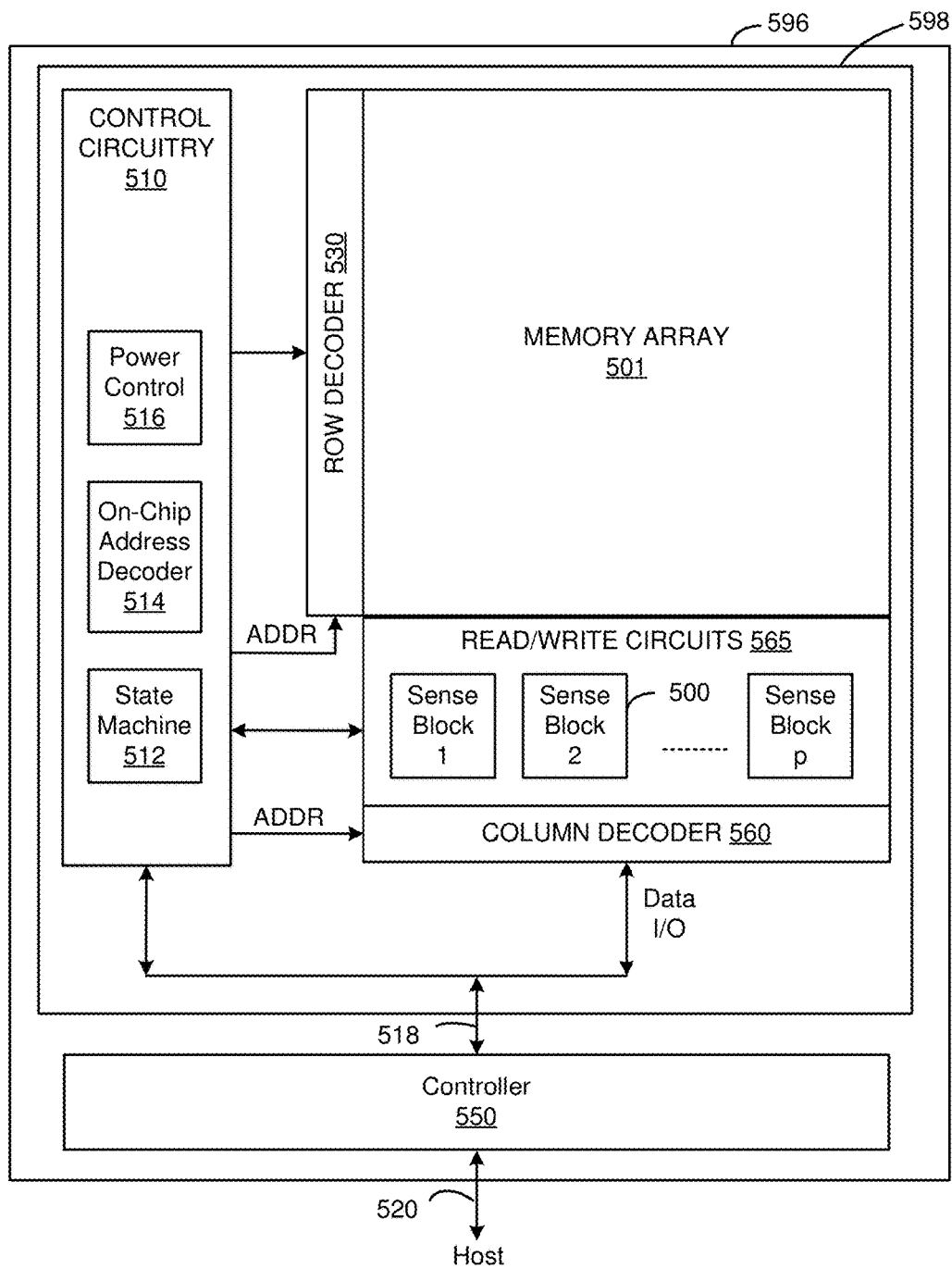
FIG. 5A depicts one embodiment of a non-volatile storage system.

FIG. 5A depicts one embodiment of a non-volatile storage system 596 including read/write circuits for reading and programming a page (or other unit) of memory cells (e.g., NAND multi-level cells) in parallel. As depicted, non-volatile storage system 596 includes a memory die 598 and controller 550. Memory die 598 includes a memory array 501 (e.g., a NAND flash memory array), control circuitry 510, row decoder 530, column decoder 560, and read/write circuits 565. In one embodiment, access to the memory array 501 by the various peripheral circuits (e.g., row decoders or column decoders) is implemented in a symmetric fashion, on opposite sides of the array, so that the densities of access lines and circuitry on each side are reduced by half. The memory array 501 is addressable by word lines via a row decoder 530 and by bit lines via a column decoder 560. Word lines and bit lines are examples of memory array control lines. The read/write circuits 565 include multiple sense blocks 500 that allow a page of storage elements to be read or programmed in parallel. In some cases, controller 550 may be integrated on the memory die 598. Commands and data are transferred between the host and controller 550 via lines 520 and between the controller 550 and the memory die 598 via lines 518.

The control circuitry 510 cooperates with the read/write circuits 565 to perform memory operations on the memory array 501. The control circuitry 510 includes a state machine 512, an on-chip address decoder 514, and a power control module 516. The state machine 512 provides chip-level control of memory operations. The on-chip address decoder 514 provides an address interface between the addresses used by the host and the hardware addresses used by the decoders 530 and 560. The power control module 516 controls the power and voltages supplied to the word lines and bit lines during memory operations. In one embodiment, a power control module 516 includes one or more charge pumps that may generate voltages greater than the supply voltage.

In some embodiments, one or more of the components (alone or in combination), other than memory array 501, may be referred to as a managing or control circuit. For example, one or more managing or control circuits may include any one of or a combination of control circuitry 510, state machine 512, decoders 530/560, power control 516, sense blocks 500, read/write circuits 565, and/or controller 550. The one or more managing circuits or the one or more control circuits may perform or facilitate one or more memory array operations including erasing, programming, or reading operations.

In some embodiments, one or more managing or control circuits may be used for controlling the operation of a memory array, such as memory array 501. The one or more managing or control circuits may provide control signals to the memory array in order to perform a read operation and/or a write operation on the memory array. In one example, the one or more managing or control circuits may include any one of or a combination of control circuitry, state machine, decoders, sense amplifiers, read/write circuits, and/or controllers. The one or more control circuits may enable or facilitate one or more memory array operations including erasing, programming, or reading operations to be performed on the memory array. In one example, the one or more control circuits may comprise an on-chip memory controller for determining row and column addresses, word line and bit line addresses, memory array enable signals, and/or data latching signals.

In one embodiment, memory array 501 may be divided into a large number of blocks (e.g., blocks 0-1023, or another amount) of memory cells. As is common for flash memory systems, the block may be the unit of erase. That is, each block may contain the minimum number of memory cells that are erased together. Other units of erase can also be used. A block contains a set of NAND strings which are accessed via bit lines and word lines. Typically, all of the NAND strings in a block share a common set of word lines.

Each block may be divided into a particular number of pages. In one embodiment, a page may be the unit of programming. Other units of programming can also be used. One or more pages of data are typically stored in one row of memory cells. For example, one or more pages of data may be stored in memory cells connected to a common word line. In one embodiment, the set of memory cells that are connected to a common word line are programmed simultaneously. A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

Figure 5B:
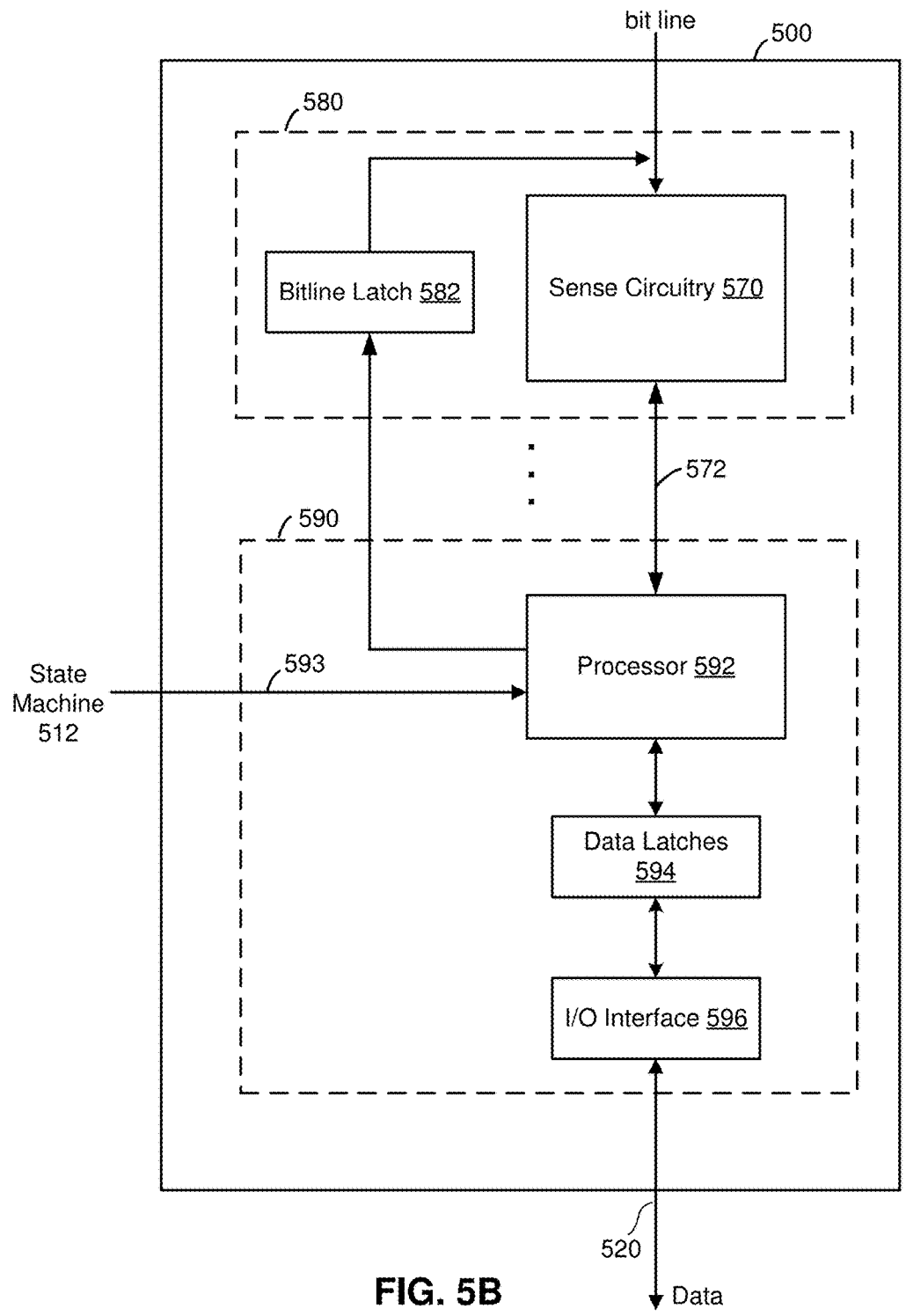
FIG. 5B depicts one embodiment of a sense block.

FIG. 5B depicts one embodiment of a sense block 500, such as sense block 500 in FIG. 5A. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block may include one common portion 590 and eight sense modules 580. Each of the sense modules in a group may communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. In one example, a data value or an analog voltage latched in bit line latch 582 may result in the connected bit line being biased to a particular bit line voltage during a memory operation (e.g., a read operation or a program verify operation).

In one embodiment, the bit line latch 582 may comprise a dynamic latch or a static latch. In one example, the bit line latch 582 may comprise a dynamic latch that latches or stores an analog voltage that is used for controlling the gate of an NMOS transistor in a source follower configuration that is used to bias a bit line to a particular bit line voltage.

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches. The set of data latches 594 may be used to store data bits determined by processor 592 during a read operation or to store data bits imported from the data bus 520 during a program operation. The imported data bits represent write data meant to be programmed into a memory array, such as memory array 501 in FIG. 5A. I/O interface 596 provides an interface between data latches 594 and the data bus 520.

During a read operation or other storage element sensing operation, a state machine, such as state machine 512 in FIG. 5A, controls the supply of different control gate voltages to the addressed storage elements. In some cases, as it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 may serve both as a latch for latching the output of the sense module 580 and as a bit line latch for controlling a bit line voltage that is applied to a bit line.

During a programming operation, the data to be programmed is stored in the set of data latches 594. The programming operation, under the control of the state machine 512, may comprise a series of programming voltage pulses applied to the control gates of the addressed storage elements. Each program pulse is followed by a read back (or verify operation) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during a verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules may be configured such that each of its set of data latches will shift data in to or out of the data bus in sequence as if they are part of a shift register for the entire read/write block.

In some embodiments, a non-volatile storage system, such as non-volatile storage system 596 in FIG. 5A, may be implemented using an integrated circuit. The integrated circuit may include on-chip circuitry to generate a boosted voltage having a magnitude that is greater than the highest power supply voltage provided to the integrated circuit. The boosted voltage may be used for providing power to portions of the electronic circuitry located on the integrated circuit. The boosted voltage may be generated using an on-chip charge pump system. In some cases, a charge pump system may be used to generate an output voltage that is greater than the highest supply voltage provided to the integrated circuit. In other cases, a charge pump system may be used to generate an output voltage that is less than the lowest supply voltage provided to the integrated circuit (e.g., a negative charge pump system may generate a voltage that is less than ground or VSS). In some cases, a charge pump system may generate a power supply voltage for a sense amplifier (e.g., VDDSA).

FIG. 6A depicts one embodiment of a portion of a sense amplifier for biasing a bit line to a particular bit line voltage. In some cases, the portion of the sense amplifier may correspond with a portion of sense module 580 in FIG. 5B. As depicted, rather than using NMOS transistor 603 to set the bit line voltage applied to the bit line BL, NMOS transistor 606 is used to set the bit line voltage applied to the bit line BL. The NMOS transistor 606 may be arranged in a source follower configuration to set the bit line voltage applied to the bit line BL via the current path 604. In this case, the gate INV of the NMOS transistor 606 may be set to an appropriate voltage in order to set the source of the NMOS transistor 606 to the bit line voltage. The appropriate voltage applied to the gate INV of the NMOS transistor 606 may comprise an NMOS transistor threshold voltage above the bit line voltage.

FIG. 6B depicts one embodiment of a table showing various settings for the gate INV of NMOS transistor 606 in FIG. 6A. The gate BLC of NMOS transistor 603 may be set to VX or another voltage substantially above the bit line voltage to be applied to the bit line BL in order to allow NMOS transistor 606 to set or determine the bit line voltage applied to the bit line BL. As depicted, in a first situation 610, the gate INV of NMOS transistor 606 may be set to a first bit line voltage VBL1 plus an NMOS transistor threshold voltage Vtn in order to clamp or set the bit line BL to the first bit line voltage VBL1. In a second situation 611, the gate INV of NMOS transistor 606 may be set to a second bit line voltage VBL2 different from the first bit line voltage VBL1 plus an NMOS transistor threshold voltage Vtn in order to clamp or set the bit line BL to the second bit line voltage VBL2. In a third situation 612, the gate INV of NMOS transistor 606 may be set to a low voltage or VSS in order to set the bit line BL to VSS. In some cases, the voltage settings used during the third situation may be applied when a programming state is not to be verified during a program verify operation.

FIG. 6C depicts one embodiment of a portion of a sense amplifier that may be used for biasing a bit line to a particular bit line voltage during a program verify operation. In some cases, the portion of the sense amplifier may correspond with a portion of sense module 580 in FIG. 5B. As depicted, during a program verify operation, the NMOS transistor 626 may be used as a source follower in order to bias the bit line BL to a particular bit line voltage (e.g., corresponding with a verify voltage level for a memory cell connected to the bit line BL). The gate INV of the NMOS transistor 626 may be set to a particular voltage level during the program verify operation such that the bit line BL is biased to the particular bit line voltage. In one example, the particular voltage level may be equal to the particular bit line voltage plus an NMOS transistor threshold voltage. The gate INV of the NMOS transistor 626 may be set via a dynamic latch 622 for storing an analog voltage corresponding with the particular voltage level. In one embodiment, the dynamic latch 622 may be set via NMOS transistor 627. The gate DSET of the NMOS transistor 627 may be biased such that the INV node of the dynamic latch 622 stores the appropriate analog voltage for the dynamic latch. In one example, the gate DSET of the NMOS transistor 627 may be biased to be voltage equal to the appropriate analog voltage plus an NMOS transistor threshold voltage. The DSET node may be adjusted over time during an initialization phase such that a number of dynamic latches associated with a plurality of sense amplifiers may latch or store various analog voltages for biasing a plurality of bit lines to various bit line voltages during a program verify operation.

In one embodiment, during an initialization phase, the INV node of the dynamic latch 622 may be loaded via the BUS node connected to data latches ADL, BDL, CDL, DDL, and TDL for storing state information. During the initialization phase, the gate DSET of the NMOS transistor 627 may be biased to a voltage equal to a transistor threshold voltage above the desired analog voltage to be stored on the INV node and the BUS node may be set to a high voltage (e.g., VDDSA) to charge up the INV node to the desired analog voltage. To set the BUS node to the high voltage (e.g., 5V), the sensing node SEN may be set to a low voltage (e.g., VSS of 0V).

In some cases, the dynamic latches that store the highest verify voltage levels may be loaded before other dynamic latches that store lower verify voltage levels. In one example, a first set of dynamic latches that store a first voltage level (e.g., 5V) may be loaded prior to a second set of dynamic latches that store a second voltage level less than the first voltage level (e.g., 4V). One reason for loading the dynamic latches that store higher voltage levels prior to dynamic latches that store lower voltage levels is that a lower DSET voltage used for loading the lower voltage levels may prevent the INV nodes of the dynamic latches storing the higher voltage levels from losing charge through the NMOS transistor 627. The charge loss may be prevented as both the source and the drain of the NMOS transistor 627 may be greater than an NMOS transistor threshold voltage below the voltage applied to the gate DSET of the NMOS transistor 627.

In one embodiment, during a program verify operation, after the initialization phase has loaded the dynamic latches of the sense amplifiers to the appropriate analog voltage levels for biasing various bit lines to various bit line voltages during the program verify operation, a sensing operation may be performed in which the sensing node SEN is set to a high voltage (e.g., VDDSA) and the NMOS transistor 626 is set into a source follower configuration. In this configuration, the gate INV of the NMOS transistor 626 may then bias the bit line BL to the appropriate bit line voltage during the sensing operation (e.g., to verify that a memory cell has been programmed to the correct threshold voltage level).

In one example, a first sense amplifier electrically coupled to a first bit line during a program verify operation may bias the first bit line to a first bit line voltage (e.g., 5V) and a second sense amplifier electrically coupled to a second bit line during the program verify operation may bias the second bit line to a second bit line voltage different from the first that line voltage (e.g., 3V). Thus, in this case, two different verify voltage levels may be verified during the same program verify operation or verified concurrently. The first bit line may be connected to a first memory cell and the second bit line may be connected to a second memory cell. The first memory cell and the second memory cell may be connected to a common word line. The first memory cell and the second memory cell may correspond with floating-gate transistors or comprise ReRAM memory cells.

FIG. 7A is a flowchart describing one embodiment of a process for performing a program verify operation. In one embodiment, the process of FIG. 7A may be performed by a sense block, such as sense block 500 in FIG. 5B, or a sense amplifier, such as the sense amplifier depicted in FIG. 6C.

In step 702, a first set of memory cells is programmed to a first programming state (e.g., one out of four different programming states such as the B state). In step 704, a second set of memory cells is programmed to a second programming state different from the first programming state (e.g., the C state). In step 706, a first set of sense amplifiers is electrically coupled to a first set of bit lines connected to the first set of memory cells. In step 708, a second set of sense amplifiers is electrically coupled to a second set of bit lines connected to the second set of memory cells. In step 710, a first set of dynamic latches associated with the first set of sense amplifiers is set to a first voltage. In one example, a dynamic latch of the first set of dynamic latches may correspond with dynamic latch 622 in FIG. 6C. The first voltage may correspond with an analog voltage that has been stored using the dynamic latch. In step 712, a second set of dynamic latches associated with the second set of sense amplifiers is set to a second voltage different from the first voltage. In one example, the first voltage may comprise 5.5V and the second voltage may comprise 3.2V.

In step 714, a program verify operation is performed during which it is verified that the first set of memory cells have been programmed to the first programming state and the second set of memory cells have been programmed to the second programming state. The programming states of the first set of memory cells and the second set of memory cells may be concurrently verified or verified at the same time by sensing the first set of memory cells and the second set of memory cells concurrently. In some cases, the first voltage stored by the first set of dynamic latches may cause the first set of bit lines to be biased to a first bit line voltage during the program verify operation. The second voltage stored by the second set of dynamic latches may cause the second set of bit lines to be biased to a second line voltage different from the first bit line voltage during the program verify operation.

FIG. 7B is a flowchart describing another embodiment of a process for performing a program verify operation. In one embodiment, the process of FIG. 7B may be performed by a sense block, such as sense block 500 in FIG. 5B, or a sense amplifier, such as the sense amplifier depicted in FIG. 6C.

In step 732, a first intended programming state (e.g., the A state or the S1 data state) for a first memory cell is identified. The first memory cell may be programmed to the first intended programming state by applying one or more programming pulses to the first memory cell. In step 734, a second intended programming state different from the first intended programming state (e.g., the B state or the S2 data state) is identified for a second memory cell. In some cases, the second memory cell may be programmed to the second intended programming state by applying the one or more programming pulses to the second memory cell and/or applying one or more other programming pulses to the second memory cell. In step 736, a first sense amplifier is electrically coupled to a first bit line connected to the first memory cell. The first sense amplifier may be electrically coupled to the first bit line such that current drawn by the first memory cell may be sensed by the first sense amplifier. In step 738, a second sense amplifier is electrically coupled to a second bit line connected to the second memory cell. The second sense amplifier may be electrically coupled to the second bit line such that current drawn by the second memory cell may be sensed by the second sense amplifier.

In step 740, the first bit line is biased to a first bit line voltage while the second bit line is biased to a second line voltage different from the first bit line voltage. In this case, the first bit line and the second bit line may be concurrently biased to two different bit line voltages. In step 742, a first current drawn by the first memory cell is sensed while the first bit line is biased to the first bit line voltage. In step 744, a second current drawn by the second memory cell is sensed while the second bit line is biased to the second bit line voltage. In step 746, it is verified that the first memory cell was programmed to the first intended programming state based on the first current drawn by the first memory cell. In step 748, it is verified that the second memory cell was programmed to the second intended programming state based on the second current drawn by the second memory cell. The determination that the first memory cell was programmed to the first intended programming state and the second memory cell was programmed to the second intended programming state may be performed at the same time while the first bit line is biased to the first bit line voltage and while the second bit line is biased to the second bit line voltage.

One embodiment of the disclosed technology includes a first sense amplifier and a second sense amplifier. The first sense amplifier configured to identify a first programming state for a first memory cell and bias a first bit line connected to the first memory cell to a first bit line voltage based on the first programming state at a first point in time. The second sense amplifier configured to identify a second programming state different from the first programming state for a second memory cell and bias a second bit line connected to the second memory cell to a second bit line voltage based on the second programming state at the first point in time.

One embodiment of the disclosed technology includes identifying a first programming state for a first memory cell, identifying a second programming state different from the first programming state for a second memory cell, and concurrently verifying that the first memory cell has been programmed to the first programming state and the second memory cell has been programmed to the second programming state. The concurrently verifying includes biasing a first bit line connected to the first memory cell to a first bit line voltage while biasing a second bit line connected to the second memory cell to a second bit line voltage different from the first bit line voltage.

One embodiment of the disclosed technology includes a memory array including a first memory cell and a second memory cell and one or more control circuits configured to identify a first programming state for the first memory cell and identify a second programming state different from the first programming state for the second memory cell. The one or more control circuits configured to store a first voltage based on the first programming state and to store a second voltage different from the first voltage based on the second programming state. The one or more control circuits configured to bias a first bit line connected to the first memory cell to a first bit line voltage based on the first voltage while a second bit line connected to the second memory cell is biased to a second bit line voltage different from the first bit line voltage based on the second voltage. The one or more control circuits configured to sense a first current from the first memory cell while the first bit line is biased to the first bit line voltage and sense a second current from the second memory cell while the second bit line is biased to the second bit line voltage.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
a first sense amplifier configured to identify a first programming state for a first memory cell and bias a first bit line connected to the first memory cell to a first bit line voltage based on the first programming state at a first point in time, the first sense amplifier configured to sense a first current from the first memory cell while the first bit line is biased to the first bit line voltage; and
a second sense amplifier configured to identify a second programming state different from the first programming state for a second memory cell and bias a second bit line connected to the second memory cell to a second bit line voltage based on the second programming state at the first point in time, the second sense amplifier configured to sense a second current from the second memory cell while the second bit line is biased to the second bit line voltage, the first sense amplifier configured to set a first node associated with the first sense amplifier to a first voltage and the second sense amplifier configured to set a second node associated with the second sense amplifier to a second voltage different from the first voltage, the first sense amplifier configured to set the first node to the first voltage prior to the second node being set to the second voltage.

2. The apparatus of claim 1, wherein:
the first sense amplifier configured to verify that the first memory cell has been programmed to the first programming state while the first bit line is biased to the first bit line voltage; and
the second sense amplifier configured to verify that the second memory cell has been programmed to the second programming state while the second bit line is biased to the second bit line voltage and while the first bit line is biased to the first bit line voltage.

3. The apparatus of claim 1, wherein:
the first sense amplifier configured to set a gate of a first NMOS transistor connected to the first bit line to the first voltage; and
the second sense amplifier configured to set a gate of a second NMOS transistor connected to the second bit line to the second voltage.

4. The apparatus of claim 1, wherein:
the first bit line voltage is greater than the second bit line voltage.

5. The apparatus of claim 1, wherein:
the first memory cell corresponds with a first floating-gate transistor; and
the second memory cell corresponds with a second floating-gate transistor.

6. The apparatus of claim 1, wherein:
the first memory cell corresponds with a first ReRAM memory cell; and
the second memory cell corresponds with a second ReRAM memory cell.

7. The apparatus of claim 1, wherein:
the first memory cell and the second memory cell are part of a memory array, the memory array comprises a three-dimensional memory array.

8. The apparatus of claim 1, wherein:
the first memory cell and the second memory cell are part of a memory array, the memory array comprises a non-volatile memory that is monolithically formed in one or more physical levels of memory cells having active areas disposed above a silicon substrate.

9. A method, comprising:
identifying a first programming state for a first memory cell;
identifying a second programming state different from the first programming state for a second memory cell; and
concurrently verifying that the first memory cell has been programmed to the first programming state and the second memory cell has been programmed to the second programming state, the concurrently verifying includes sensing a first current from the first memory cell using a first sense amplifier while sensing a second current from the second memory cell using a second sense amplifier, the concurrently verifying includes setting a first node associated with the first sense amplifier to a first voltage and setting a second node associated with the second sense amplifier to a second voltage different from the first voltage, the concurrently verifying includes setting the first node to the first voltage prior to setting the second node to the second voltage.

10. The method of claim 9, wherein:
the concurrently verifying includes biasing a first bit line connected to the first memory cell to a first bit line voltage while biasing a second bit line connected to the second memory cell to a second bit line voltage different from the first bit line voltage.

11. The method of claim 10, wherein:
the concurrently verifying includes electrically coupling the first sense amplifier to the first bit line and electrically coupling the second sense amplifier to the second bit line.

12. The method of claim 10, wherein:
the first bit line voltage is greater than the second bit line voltage.

13. The method of claim 10, wherein:
the concurrently verifying includes setting a gate of a first NMOS transistor connected to the first bit line to a first voltage such that the first bit line is biased to the first bit line voltage and setting a gate of a second NMOS transistor connected to the second bit line to a second voltage such that the second bit line is biased to the second bit line voltage.

14. The method of claim 13, wherein:
the concurrently verifying includes determining the first voltage based on the first programming state and determining the second voltage based on the second programming state.

15. The method of claim 9, wherein:
the first voltage is greater than the second voltage.

16. The method of claim 9, wherein:
the first memory cell and the second memory cell are part of a memory array, the memory array comprises a non-volatile memory that is monolithically formed in one or more physical levels of memory cells having active areas disposed above a silicon substrate.

17. A system, comprising:
a memory array including a first memory cell and a second memory cell; and
a plurality of sense amplifiers configured to program the first memory cell to a first programming state of a plurality of programming states and program the second memory cell to a second programming state of the plurality of programming states for the second memory cell, the plurality of sense amplifiers configured to bias a first bit line connected to the first memory cell to a first bit line voltage based on the first programming state while a second bit line connected to the second memory cell is biased to a second bit line voltage different from the first bit line voltage based on the second programming state, the plurality of sense amplifiers configured to sense a first current from the first memory cell while the first bit line is biased to the first bit line voltage and sense a second current from the second memory cell while the second bit line is biased to the second bit line voltage, the plurality of sense amplifiers configured to concurrently verify that the first memory cell has been programmed to the first programming state and the second memory cell has been programmed to the second programming state, the plurality of sense amplifiers configured to set a first node associated with a first sense amplifier to a first voltage and a second node associated with a second sense amplifier to a second voltage different from the first voltage, the plurality of sense amplifiers configured to set the first node to the first voltage prior to the second node being set to the second voltage.

18. A system, comprising:
a plurality of memory cells including a first memory cell and a second memory cell;
means for identifying a first programming state for the first memory cell;
means for identifying a second programming state different from the first programming state for the second memory cell; and
means for concurrently verifying that the first memory cell has been programmed to the first programming state and the second memory cell has been programmed to the second programming state, the concurrently verifying includes sensing a first current from the first memory cell using a first sense amplifier while sensing a second current from the second memory cell using a second sense amplifier, the concurrently verifying includes setting a first node associated with the first sense amplifier to a first voltage and setting a second node associated with the second sense amplifier to a second voltage different from the first voltage, the concurrently verifying includes setting the first node to the first voltage prior to setting the second node to the second voltage.

* * * * *